(12) United States Patent
Chen et al.

(10) Patent No.: US 9,681,749 B2
(45) Date of Patent: Jun. 20, 2017

(54) SLIDE RAIL ASSEMBLY

(71) Applicant: KING SLIDE WORKS CO., LTD., Kaohsiung (TW)

(72) Inventors: Ken-Ching Chen, Kaohsiung (TW); Shun-Ho Yang, Kaohsiung (TW); Zong-Sian Wong, Kaohsiung (TW); Chun-Chiang Wang, Kaohsiung (TW)

(73) Assignees: King Slide Works Co., Ltd., Kaohsiung (TW); King Slide Tehcnology Co., Ltd., Kaohsiung (TW)

( * ) Notice: Subject to any disclaimer, the term of this patent is extended or adjusted under 35 U.S.C. 154(b) by 0 days.

(21) Appl. No.: 14/937,941

(22) Filed: Nov. 11, 2015

(65) Prior Publication Data
US 2016/0296017 A1   Oct. 13, 2016

(30) Foreign Application Priority Data
Apr. 13, 2015  (TW) .............................. 104111885 A

(51) Int. Cl.
| | | |
|---|---|---|
| A47F 1/10 | (2006.01) | |
| A47B 96/07 | (2006.01) | |
| A47B 96/06 | (2006.01) | |
| H05K 7/18 | (2006.01) | |
| H05K 7/14 | (2006.01) | |
| A47B 88/49 | (2017.01) | |
| A47B 88/57 | (2017.01) | |

(52) U.S. Cl.
CPC .............. *A47B 96/07* (2013.01); *A47B 88/49* (2017.01); *A47B 88/57* (2017.01); *A47B 96/061* (2013.01); *H05K 7/1489* (2013.01); *H05K 7/183* (2013.01); *A47B 2210/0016* (2013.01)

(58) Field of Classification Search
CPC ............ A47B 88/10; A47B 2210/0081; A47B 2088/0444
See application file for complete search history.

(56) References Cited

U.S. PATENT DOCUMENTS

| | | | |
|---|---|---|---|
| 6,209,979 B1 * | 4/2001 | Fall .................... | A47B 88/0422 312/319.1 |
| 6,367,899 B1 | 4/2002 | Hwang et al. | |
| 6,375,290 B1 | 4/2002 | Lin et al. | |
| 6,412,891 B1 | 7/2002 | Liang et al. | |
| 6,705,689 B2 | 3/2004 | Chen et al. | |
| 6,851,774 B2 | 2/2005 | Chen et al. | |
| 7,571,968 B2 * | 8/2009 | Ji .......................... | A47B 88/10 312/333 |
| 7,677,679 B2 | 3/2010 | Hsiung et al. | |
| 7,857,403 B2 | 12/2010 | Chen et al. | |
| 8,240,789 B2 | 8/2012 | Chen et al. | |
| 8,528,999 B2 | 9/2013 | Chen et al. | |

* cited by examiner

*Primary Examiner* — Amy Sterling
(74) *Attorney, Agent, or Firm* — Rosenberg, Klein & Lee

(57) ABSTRACT

A slide rail assembly includes a first rail, a blocking member, a second rail, and an operating member. The first rail defines a longitudinal channel. The blocking member is attached to the first rail. The second rail is movably connected to the first rail and can be moved to an extended position relative to the first rail in the longitudinal channel to be blocked by the blocking member. The operating member is movably connected to the first rail and configured to operate the blocking member so that the second rail is allowed to be retracted relative to the first rail from the extended position.

16 Claims, 15 Drawing Sheets

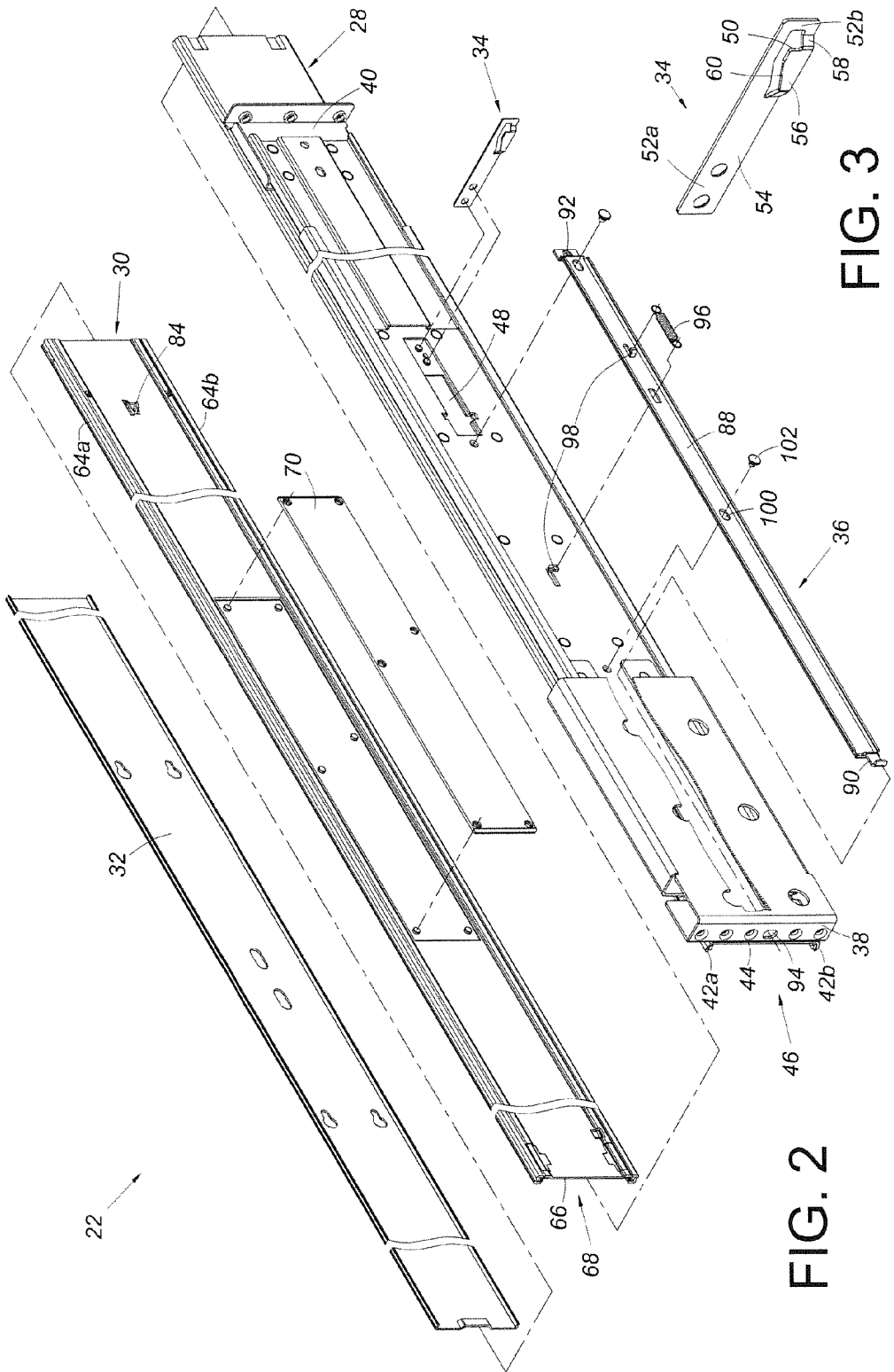

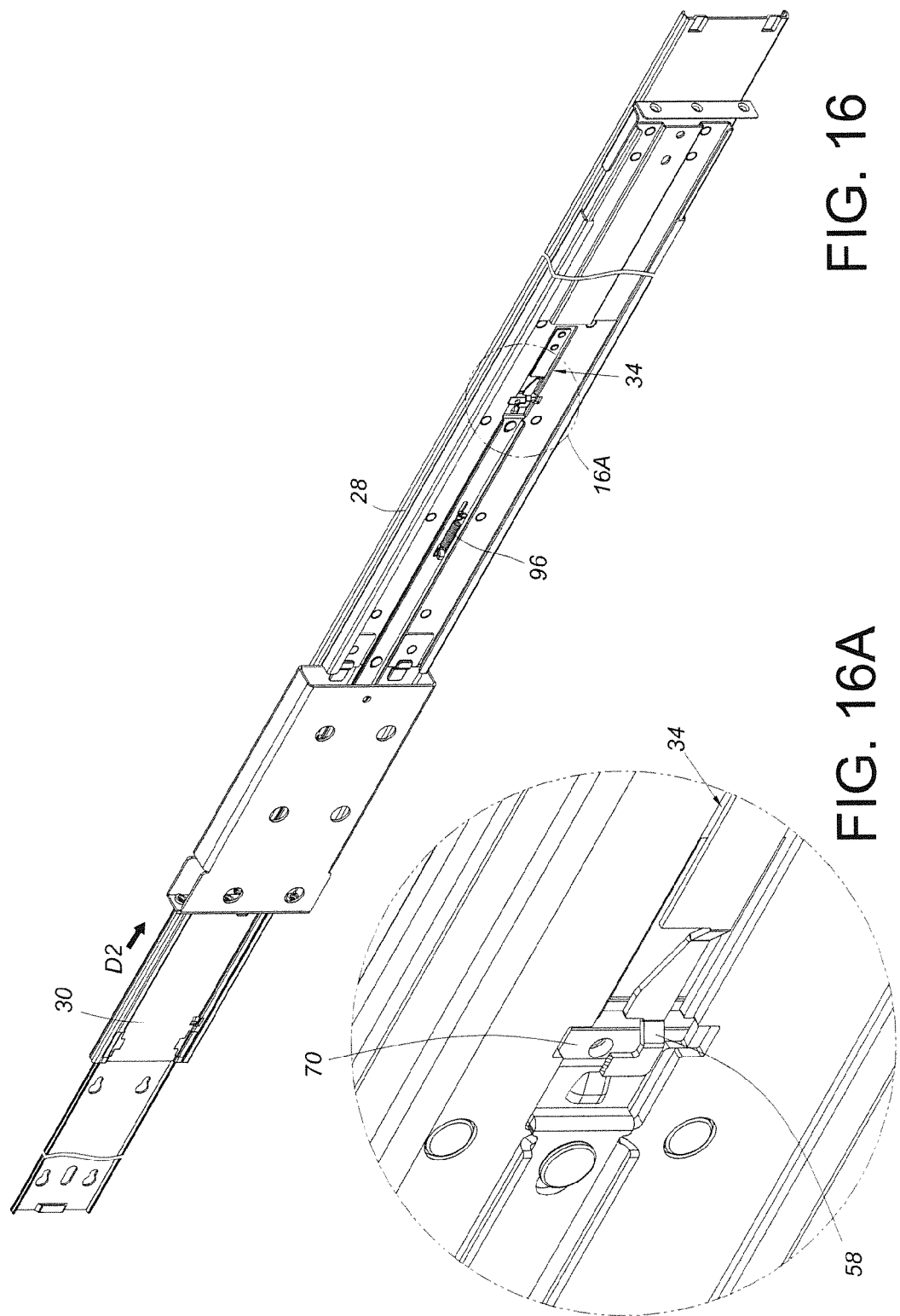

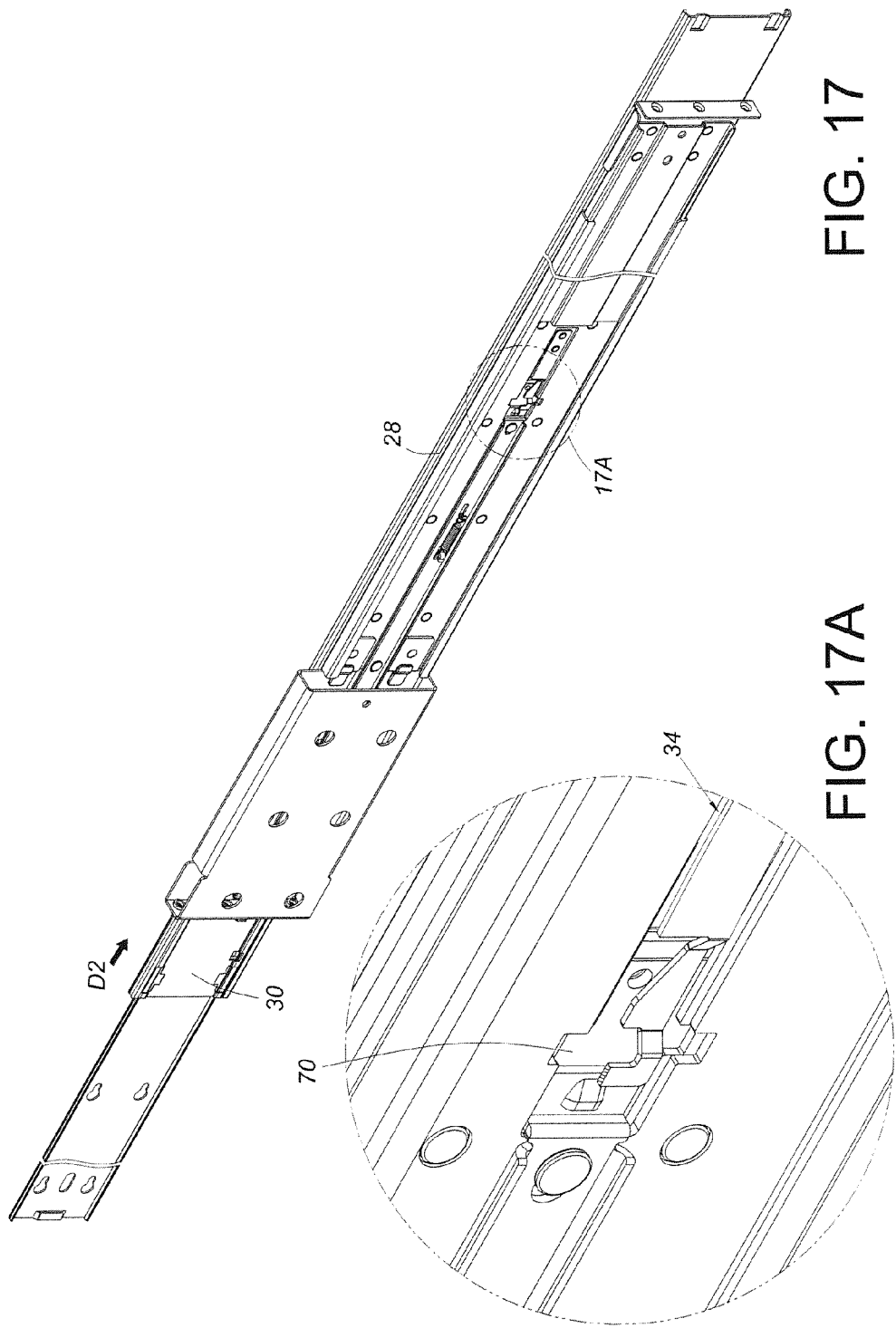

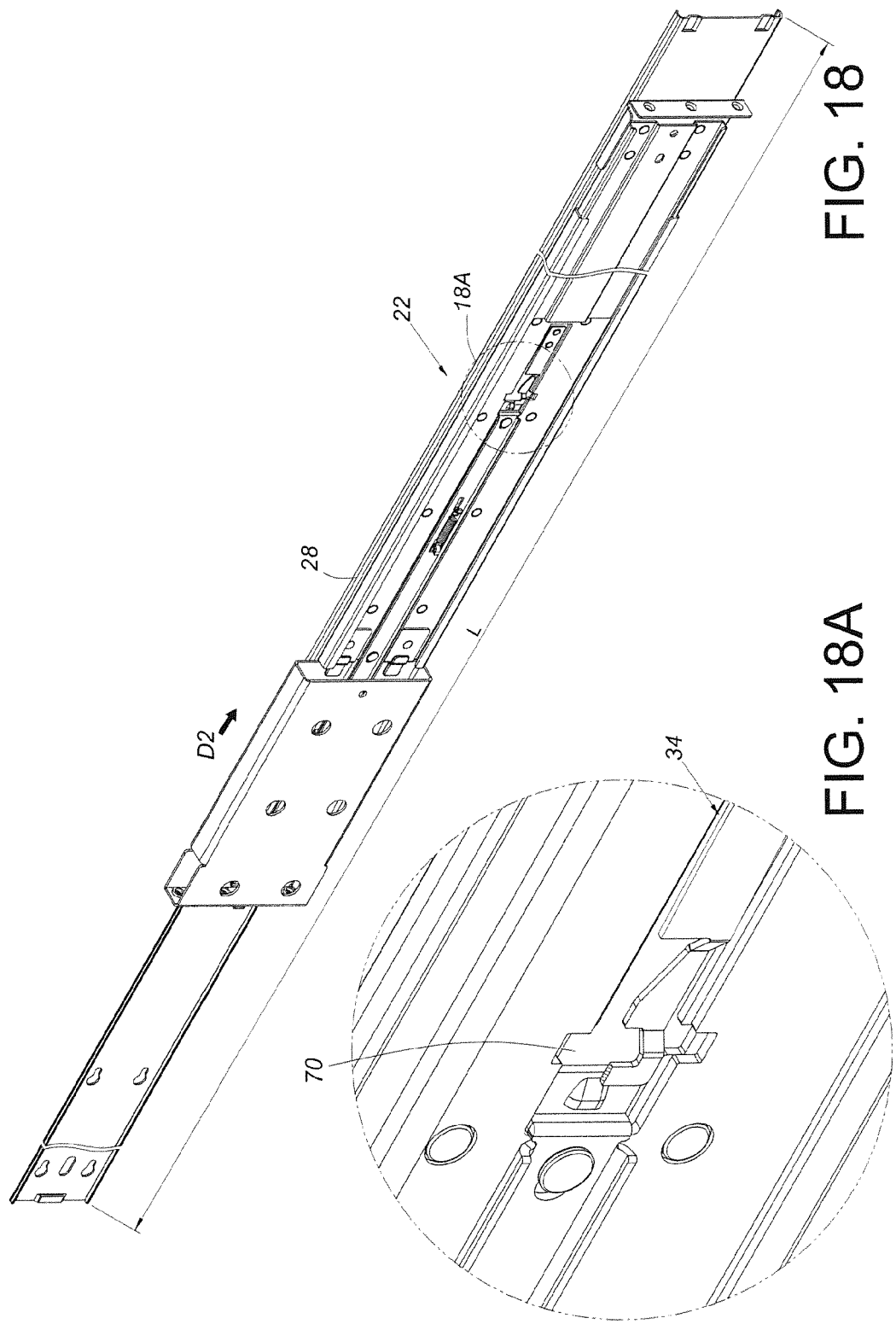

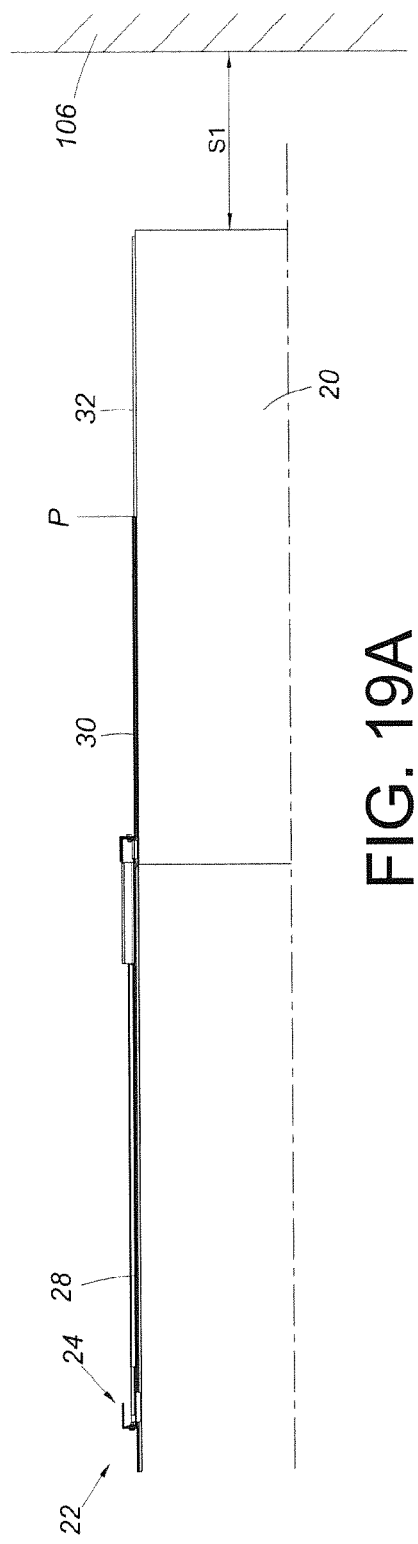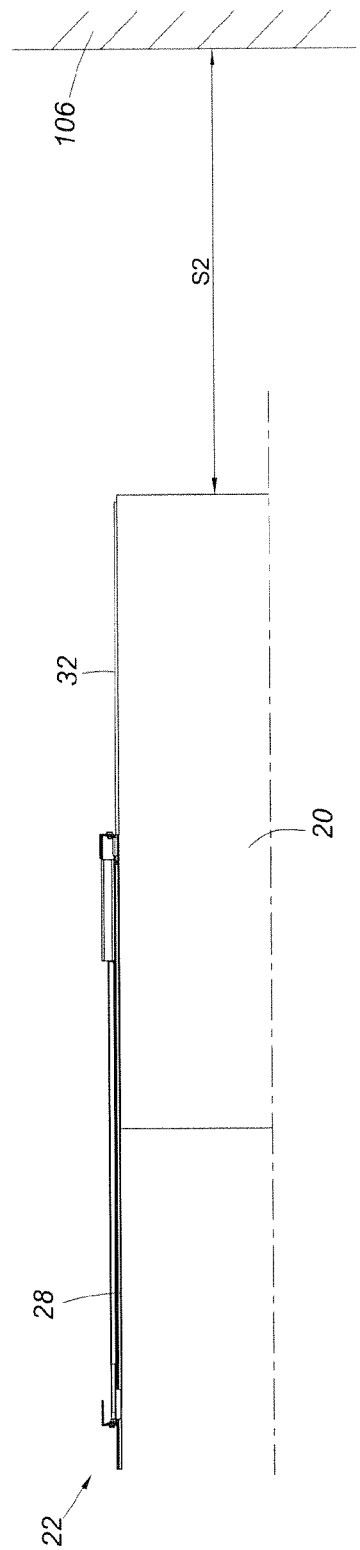

SLIDE RAIL ASSEMBLY

FIELD OF THE INVENTION

The present invention relates to a slide rail assembly and more particularly to a slide rail assembly in which a blocking mechanism can be deactivated by an operating member to allow a rail to be retracted from an extended position relative to another rail.

BACKGROUND OF THE INVENTION

Slide rail assemblies on the market are diverse in design. Typically, a slide rail assembly includes at least two slide rails which can be displaced relative to each other to bring the slide rail assembly into an extended or retracted state. In the three-section slide assembly disclosed in U.S. Pat. No. 7,677,679 B2 for example, the retention pin (40) and the stop piece (28) of the second slide (20) are respectively resisted by the stop (14) and the block (16) of the first slide (10) when the third slide (30) is in the fully extended state; consequently, the second slide (20) is retained at an extended position. When the third slide (30) is retracted relative to the second slide (20), the retention pin (40) on the second slide (20) is driven by the releasing member (50) on the third slide (30) to disengage from the stop (14) of the first slide (10) so that the second slide (20) and the third slide (30) can be retracted together relative to the first slide (10). The disclosure of the aforesaid patent is incorporated herein by reference.

SUMMARY OF THE INVENTION

The present invention relates to a slide rail assembly with an operating member for deactivating a blocking mechanism and thereby allowing a rail to be retracted from an extended position relative to another rail.

According to one aspect of the present invention, a slide rail assembly includes a first rail, a second rail, a blocking member, a positioning member, and an operating member. The first rail has an upper wall, a lower wall, and a sidewall extending between the upper wall and the lower wall and having an opening, wherein the upper wall, the lower wall, and the sidewall jointly define a longitudinal channel. The second rail is movably connected to the first rail and can be displaced relative to the first rail in the longitudinal channel. The blocking member is attached to the first rail and has a stop wall corresponding to the opening. The positioning member is arranged at the second rail and has a portion to be blocked by the stop wall when the second rail is displaced to an extended position relative to the first rail. The operating member is movably connected to the first rail and is configured to operate the blocking member and thereby release the portion of the positioning member from the stop wall of the blocking member.

According to another aspect of the present invention, a slide rail assembly is adapted for mounting an object to a rack, wherein the rack includes a first post and a second post. The slide rail assembly includes a first rail, a second rail, a third rail, a blocking member, a positioning member, and an operating member. The first rail is connected to the first post and the second post of the rack via a first bracket and a second bracket respectively. The first rail includes an upper wall, a lower wall, and a sidewall extending between the upper wall and the lower wall and having an opening, wherein the upper wall, the lower wall, and the sidewall jointly define a longitudinal channel. The second rail is movably connected to the first rail and can be displaced to an extended position relative to the first rail in the longitudinal channel. The third rail is connected to the second rail in a longitudinally movable manner and is configured to be mounted with the object. The blocking member is attached to the first rail and has a stop wall corresponding to the opening. The positioning member is arranged at the second rail and has a portion to be blocked by the stop wall when the second rail is displaced to the extended position. The operating member is movably connected to the first rail and is configured to operate the blocking member and thereby release the portion of the positioning member from the stop wall so that the second rail is allowed to be retracted from the extended position relative to the first rail.

According to yet another aspect of the present invention, a slide rail assembly includes a first rail, a blocking member, a second rail, and an operating member. The first rail defines a longitudinal channel. The blocking member is attached to the first rail. The second rail is movably connected to the first rail and can be displaced to an extended position relative to the first rail in the longitudinal channel so as to be blocked by the blocking member. The operating member is movably connected to the first rail and is configured to operate the blocking member and thereby allow the second rail to be retracted from the extended position relative to the first rail.

In some embodiments of the foregoing aspects, the blocking member has a first portion connected to the sidewall of the first rail, a second portion distant from the first portion, and an auxiliary portion between the first portion and the second portion. The auxiliary portion includes a guide section adjacent to the stop wall. In the course in which the second rail is displaced toward the extended position, the portion of the positioning member can be guided by the guide section and is consequently blocked by the stop wall.

In some embodiments of the foregoing aspects, the second rail has an upper wall, a lower wall, and a sidewall extending between the upper wall and the lower wall, and the slide rail assembly further includes a connecting element which pivotally connects the positioning member to the sidewall of the second rail. The sidewall of the second rail has a mounting hole and a mounting portion. The portion of the positioning member extends through the mounting hole. A first elastic member is provided between the positioning member and the mounting portion.

In some embodiments of the foregoing aspects, the operating member is connected to the sidewall of the first rail in a longitudinally movable manner. When operated, the operating member is displaced and shifts the blocking member in a certain direction such that the portion of the positioning member is released from the stop wall of the blocking member.

In some embodiments of the foregoing aspects, the slide rail assembly further includes a second elastic member arranged between the first rail and the operating member. The second elastic member enables the operating member to automatically return from a position to an initial position. Moreover, each of the first rail and the operating member has a connecting portion, and the second elastic member has two portions respectively connected to the connecting portion of the first rail and the connecting portion of the operating member.

In some embodiments of the foregoing aspects, one of the first rail and the operating member has at least one slot, and by virtue of a connecting element extending through the at least one slot, the operating member is connected to the first rail and can be displaced relative to the first rail when operated.

In some embodiments of the foregoing aspects, the positioning member is connected to the second rail at a position adjacent to a rear portion of the second rail, and the operating member has a longitudinal main body, an operating portion, and a contact portion. The operating portion and the contact portion are respectively connected to two corresponding ends of the longitudinal main body. The contact portion is adjacent to the opening of the sidewall of the first rail. The slide rail assembly further includes a bracket connected to the first rail. The bracket includes at least one hole, and the operating portion extends through the at least one hole.

In some embodiments of the foregoing aspects, the slide rail assembly further includes a third rail and a reinforcement structure. The third rail is connected to the second rail in a longitudinally movable manner. The reinforcement structure is connected to at least one section of the second rail to increase the structural strength of the at least one section of the second rail for supporting the third rail. In addition, the blocking member includes an inclined portion. While the second rail is being displaced from the extended position in a retracting direction relative to the first rail, the reinforcement structure passes the blocking member, is guided by the inclined portion of the blocking member, and consequently presses against the blocking member to allow the second rail to be retracted relative to the first rail.

One of the advantageous features of applying the present invention is that the second rail can be blocked by the blocking member once displaced relative to the first rail to the extended position, and that by operating the blocking member with the operating member, the second rail is allowed to be retracted from the extended position relative to the first rail.

BRIEF DESCRIPTION OF THE DRAWINGS

FIG. 2 is an exploded perspective view of the slide rail assembly in an embodiment of the present invention;

FIG. 3 is an enlarged view of the blocking member of the slide rail assembly in FIG. 2;

FIG. 16 is a perspective view showing how the second rail in FIG. 15 is further retracted in a retracting direction relative to the first rail;

FIG. 16A is a partial enlarged view of the circled area 16A in FIG. 16, showing how the reinforcement structure presses against the blocking member while the second rail is retracted relative to the first rail;

FIG. 17 is a perspective view showing how the second rail in FIG. 16 is further retracted in the retracting direction relative to the first rail;

FIG. 17A is a partial enlarged view of the circled area 17A in FIG. 17, showing the reinforcement structure at a certain position relative to, and pressing against, the blocking member while the second rail is retracted relative to the first rail;

FIG. 18 is a perspective view showing the length of the slide rail assembly in that particular state;

FIG. 18A is a partial enlarged view of the circled area 18A in FIG. 18, showing how the reinforcement structure presses against the blocking member;

FIG. 19A is a drawing in which the slide rail assembly in an embodiment of the present invention is used in a certain environment to mount an object to a rack;

FIG. 19B is another drawing showing how the slide rail assembly in FIG. 19A can be used in that particular environment to mount the object to the rack;

DETAILED DESCRIPTION OF THE INVENTION

Figure 1:
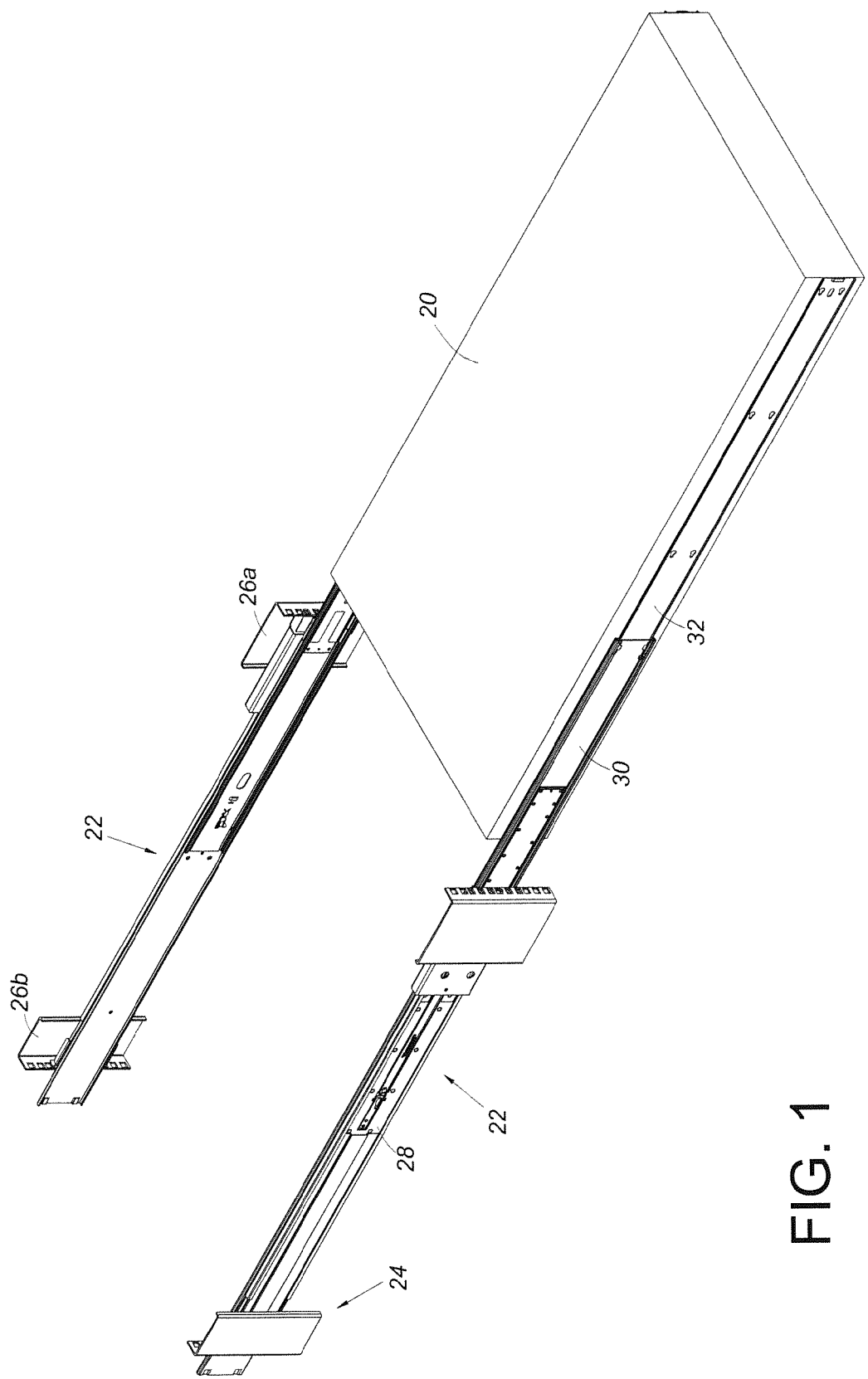
FIG. 1 is a perspective view showing how an object is mounted to, and can be pulled out of, a rack via a pair of slide rail assemblies according to an embodiment of the present invention.

FIG. 1 shows how a pair of slide rail assemblies 22 in accordance with an embodiment of the present invention are used to mount an object 20 to two pairs of posts of a rack 24. The object 20 can be the chassis of a piece of electronic equipment or any other article to be supported in the rack; the present invention imposes no limitations in this respect. Each pair of posts include a first post 26a and a second post 26b spaced apart from the first post 26a. Each slide rail assembly 22 includes a first rail 28 and a second rail 30 and may, as in this embodiment, further include a third rail 32 configured to be mounted with the object 20. The second rail 30 serves to extend the distance by which the third rail 32 can be displaced relative to the first rail 28, and consequently the distance by which the object 20 can be pulled out of the rack 24.

Referring to FIG. 2 in conjunction with FIG. 1, the slide rail assembly 22 includes a blocking member 34 and an operating member 36 in addition to the first rail 28, the second rail 30, and the third rail 32.

The first rail 28 has two portions (e.g., a front portion and a rear portion) which can be mounted to the first post 26a and the second post 26b via a first bracket 38 and a second bracket 40 respectively such that the first rail 28 lies between the two posts. The first rail 28 includes an upper wall 42a, a lower wall 42b, and a sidewall 44 extending between the upper wall 42a and the lower wall 42b. The upper wall 42a, the lower wall 42b, and the sidewall 44 jointly define a longitudinal channel 46. The sidewall 44 has an opening 48 in communication with the longitudinal channel 46.

As shown in FIG. 2 and FIG. 3, the blocking member 34 can be attached to the sidewall 44 of the first rail 28, either directly or indirectly, and hence be viewed as a part of the first rail 28. The blocking member 34 has a stop wall 50 corresponding to the opening 48 of the first rail 28. More specifically, the blocking member 34 can be an elastic plate and have a first portion 52a, a second portion 52b, a main body portion 54, and an auxiliary portion 56. The first portion 52a is configured to be connected to the sidewall 44 of the first rail 28. The second portion 52b is distant from the first portion 52a. The main body portion 54 and the auxiliary portion 56 are located between the first portion 52a and the second portion 52b. The auxiliary portion 56 is raised transversely from the main body portion 54 and extends toward the opening 48 of the first rail 28. In addition, the auxiliary portion 56 includes a guide section 60 adjacent to the stop wall 50. It is worth mentioning that, while the blocking member 34 is illustrated herein as an elastic plate, the blocking member 34 in another embodiment (not shown) can be biased by an elastic element so as to have elasticity.

As shown in FIG. 2, the second rail 30 is movably connected to the first rail 28 and can be displaced relative to the first rail 28 in the longitudinal channel 46. The second rail 30 includes an upper wall 64a, a lower wall 64b, and a sidewall 66 extending between the upper wall 64a and the lower wall 64b. The upper wall 64a, the lower wall 64b, and the sidewall 66 jointly define a longitudinal channel 68. In this embodiment, the slide rail assembly 22 further includes a reinforcement structure 70 connected to the sidewall 66 of at least one section of the second rail 30. The reinforcement structure 70 is shown as a longitudinal plate by way of example and has a thickness for enhancing the structural strength of the at least one section of the second rail 30 for supporting the third rail 32.

Figure 4B:
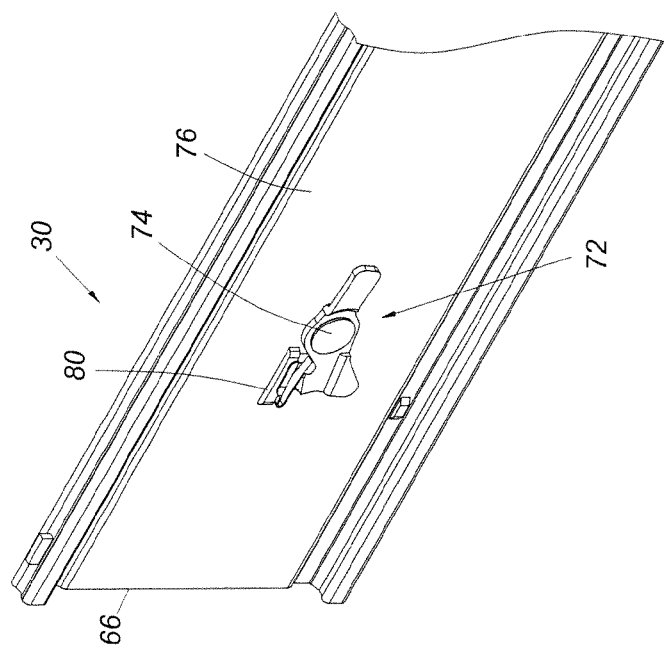
FIG. 4B is an assembled perspective view of the positioning member and the second rail in FIG. 4A.
Figure 4A:
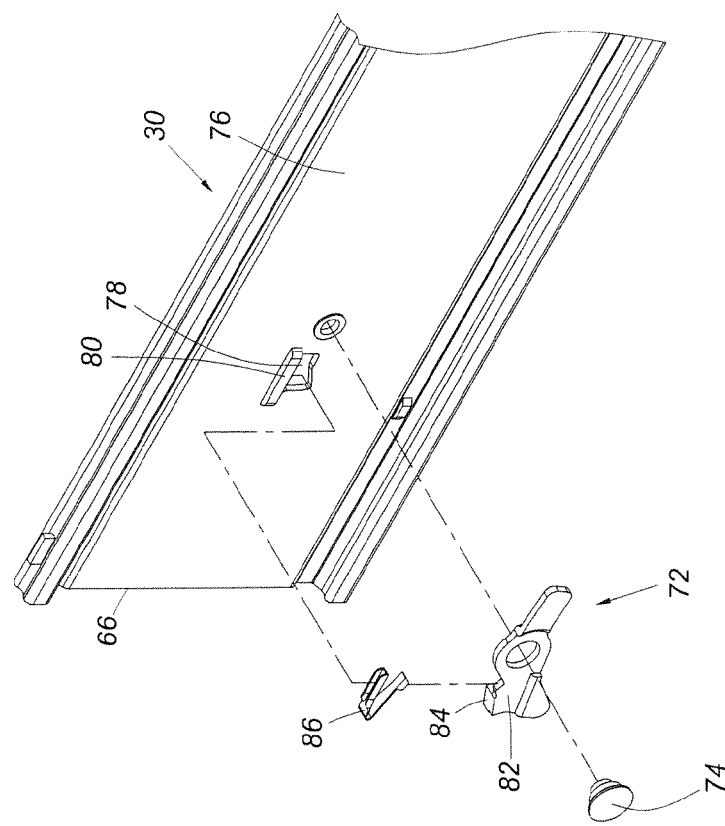
FIG. 4A is an exploded perspective view of the positioning member and the second rail of the slide rail assembly in an embodiment of the present invention.

As shown in FIG. 2, FIG. 4A, and FIG. 4B, the slide rail assembly 22 includes a positioning member 72 arranged at the second rail 30. In this embodiment, the positioning member 72 is movably (e.g., pivotally) connected to the sidewall 66 of the second rail 30 by a connecting element 74 and is adjacent to a rear portion 76 of the second rail 30. The positioning member 72 and the reinforcement structure 70 are located on different sides of the second rail 30 but are not necessarily so in practice. Preferably, the sidewall 66 of the second rail 30 further includes a mounting hole 78 and a mounting portion 80 adjacent to the mounting hole 78, and the positioning member 72 includes a main body portion 82 and a portion 84, which can be configured as transversely connected to the main body portion 82. The portion 84 of the positioning member 72 can extend through the mounting hole 78. In addition, a first elastic member 86 is provided between the positioning member 72 and the mounting portion 80. The first elastic member 86 can be an elastic clip pressed between the positioning member 72 and the mounting portion 80 but is by no means limited to this configuration. The first elastic member 86 applies an elastic force to the positioning member 72 to elastically retain the positioning member 72 at a predetermined position relative to the second rail 30.

As shown in FIG. 2, the operating member 36 is movably connected to the sidewall 44 of the first rail 28 and is configured for operating the blocking member 34. For instance, the operating member 36 has a longitudinal main body 88, an operating portion 90, and a contact portion 92, wherein the operating portion 90 and the contact portion 92 are respectively connected to two corresponding ends of the longitudinal main body 88. The operating portion 90 is adjacent to the front portion of the first rail 28 in order to be operated by an operator with ease. In this embodiment, the first bracket 38 includes at least one hole 94, and the operating portion 90 is configured to extend through the at least one hole 94. The contact portion 92, on the other hand, can be a projection adjacent to the opening 48 of the sidewall 44 of the first rail 28. Preferably, the slide rail assembly 22 further includes a second elastic member 96 arranged between the first rail 28 and the operating member 36. For example, each of the first rail 28 and the operating member 36 has a connecting portion 98, and the second elastic member 96 has two opposite portions respectively connected to the connecting portion 98 of the first rail 28 and the connecting portion 98 of the operating member 36. Besides, one of the first rail 28 and the operating member 36 may further include at least one slot 100. Here, by way of example, it is the operating member 36 that includes the at least one slot 100. By passing a portion of a connecting element 102 through the at least one slot 100 and having another portion of the connecting element 102 blocked at one side of the operating member 36, the operating member 36 is connected to the first rail 28 and can be longitudinally displaced relative to the first rail 28 as far as the length of the at least one slot 100 allows.

The third rail 32 is longitudinally movably connected to the second rail 30 and can be displaced relative to the second rail 30 in the longitudinal channel 68 of the second rail 30.

Figure 5:
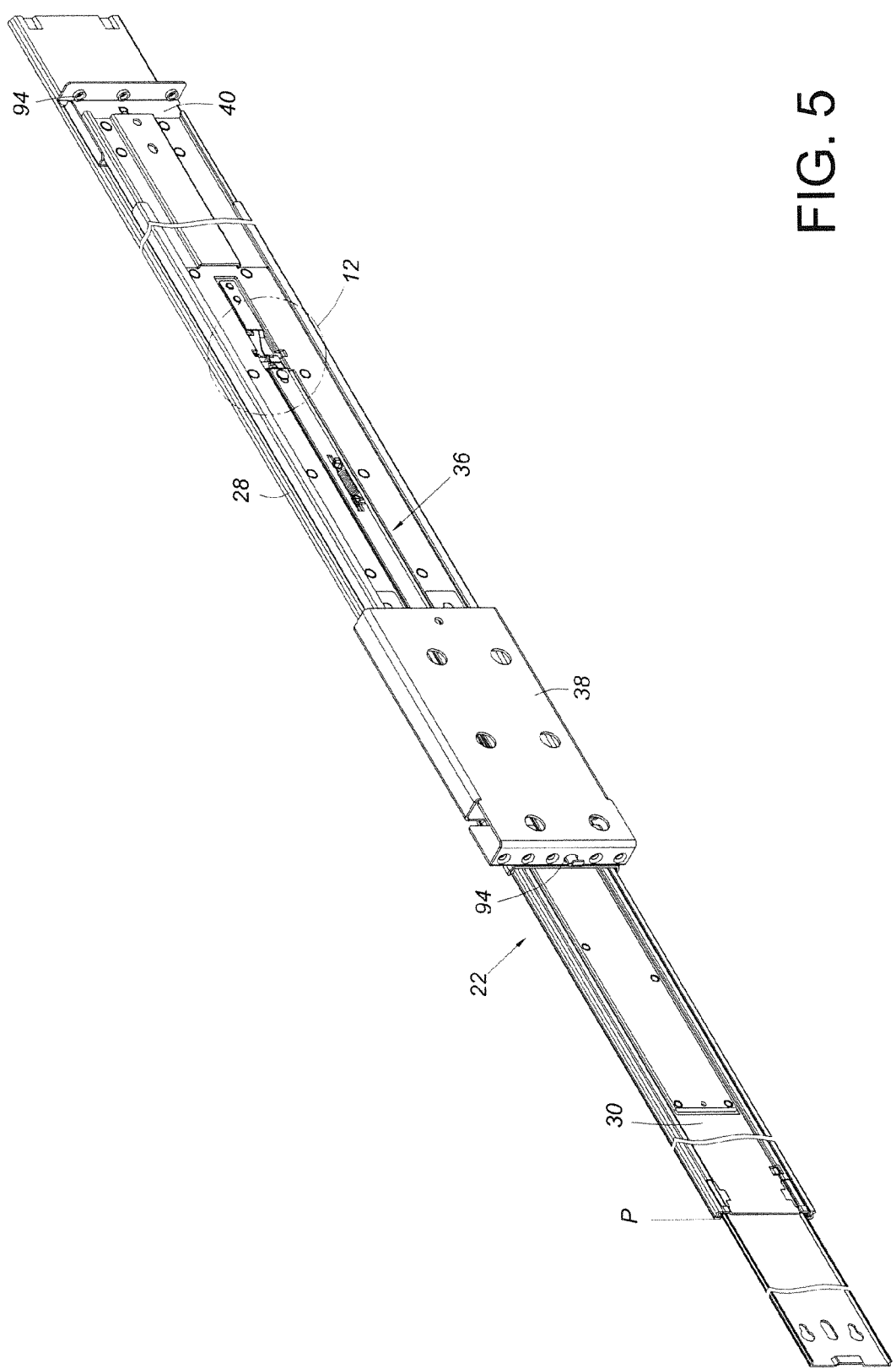
FIG. 5 is a perspective view showing how a portion of the operating member of the slide rail assembly in an embodiment of the present invention extends through a hole of a bracket.
Figure 6:
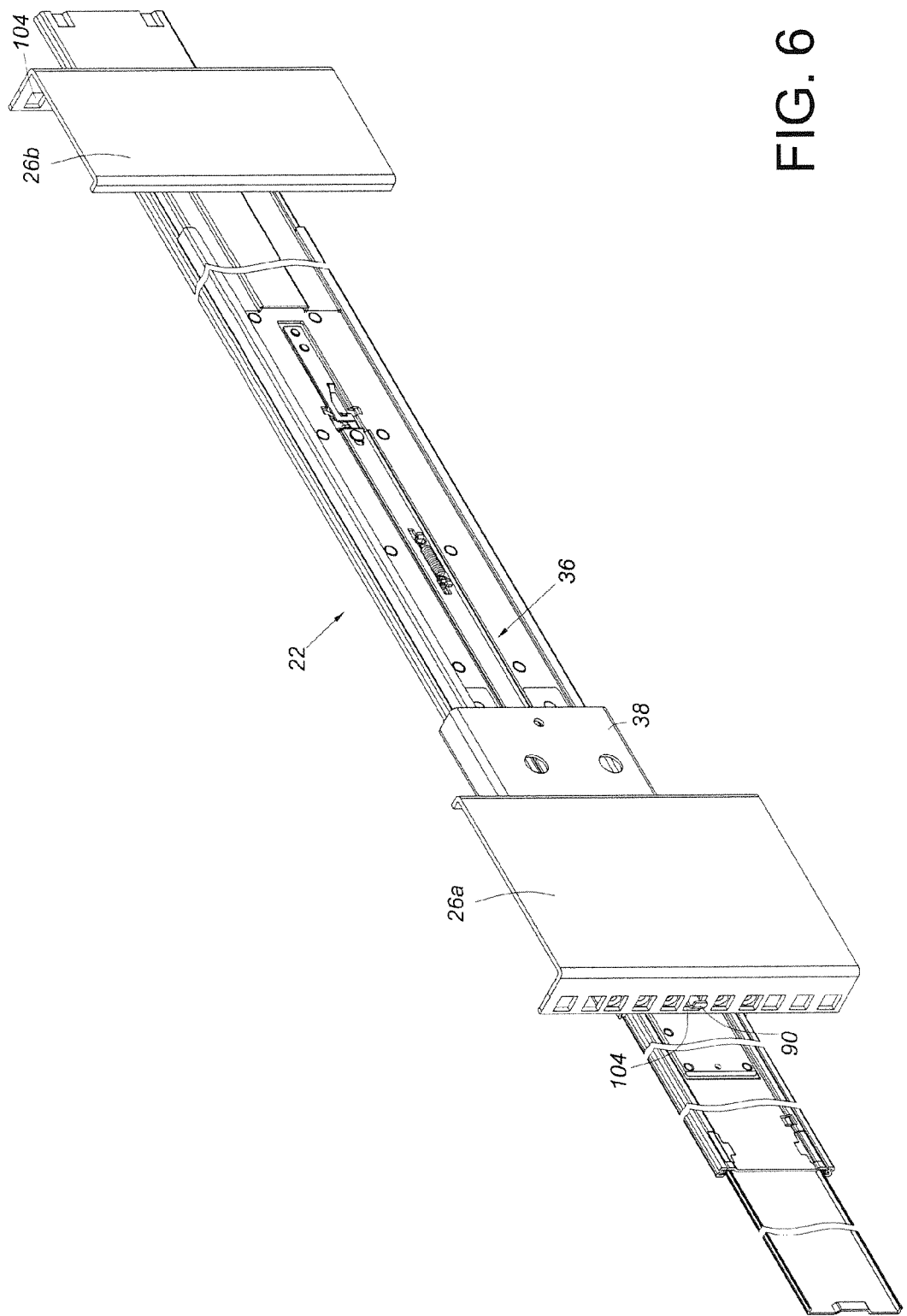
FIG. 6 is a perspective view showing how the portion of the operating member in FIG. 5 extends through a perforation of a post.

Referring to FIG. 5 and FIG. 6, the slide rail assembly 22 can be mounted to the first post 26a and the second post 26b via the first bracket 38 and the second bracket 40 respectively. More specifically, the second bracket 40 as well as the first bracket 38 may have at least one hole 94, and the at least one hole 94 of each bracket is attached with a mounting member (not shown) to be mounted to one of plural perforations 104 of the first or second post 26a, 26b in order to mount the slide rail assembly 22 to the first post 26a and the second post 26b. The operating portion 90 of the operating member 36 can be configured to extend through one of the perforations 104 of the first post 26a but is not limited to this configuration in practice.

Figure 7:
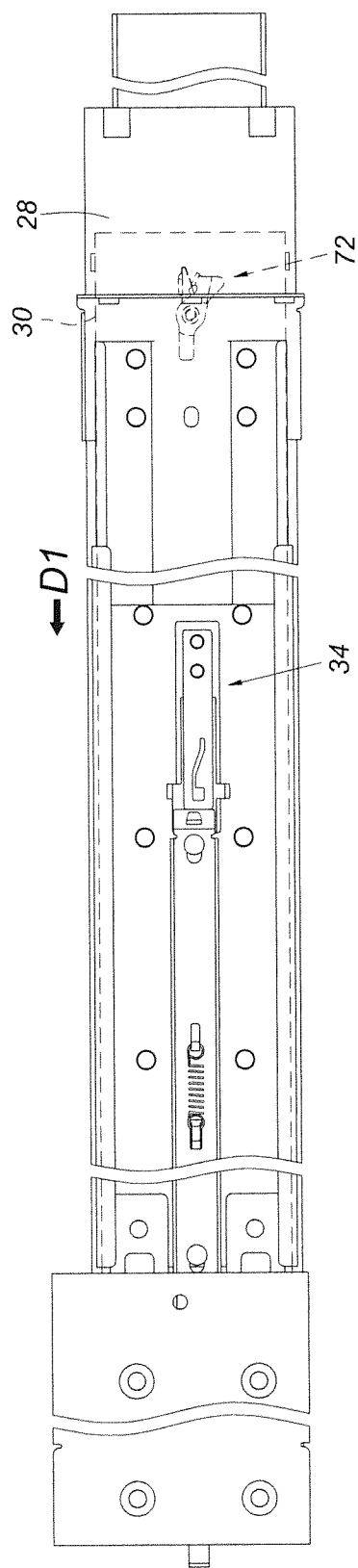
FIG. 7 is a drawing in which the positioning member of the slide rail assembly in an embodiment of the present invention has yet to be displaced to a position adjacent to the blocking member.

Referring to FIG. 7, when the second rail 30 is at a retracted position relative to the first rail 28, the positioning member 72 is spaced from the blocking member 34.

Figure 9:
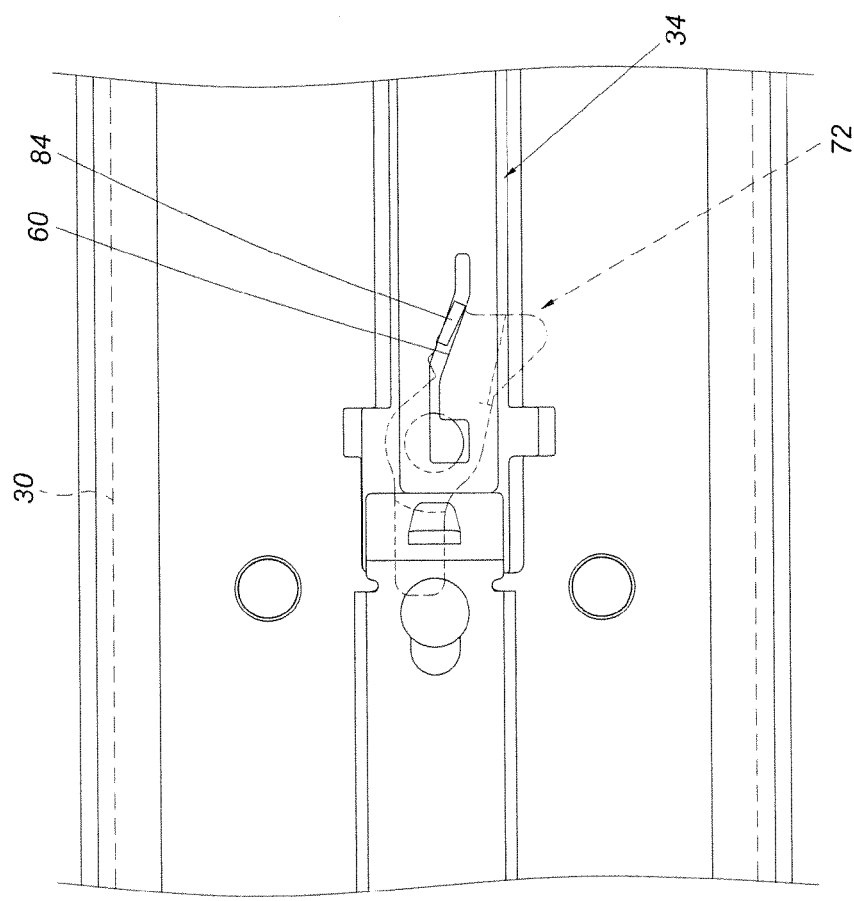
FIG. 9 is a partial enlarged plan view of FIG. 8, showing that the positioning member is displaced to a position adjacent to the blocking member, and that a portion of the positioning member is guided by the guide section of the blocking member.
Figure 8:
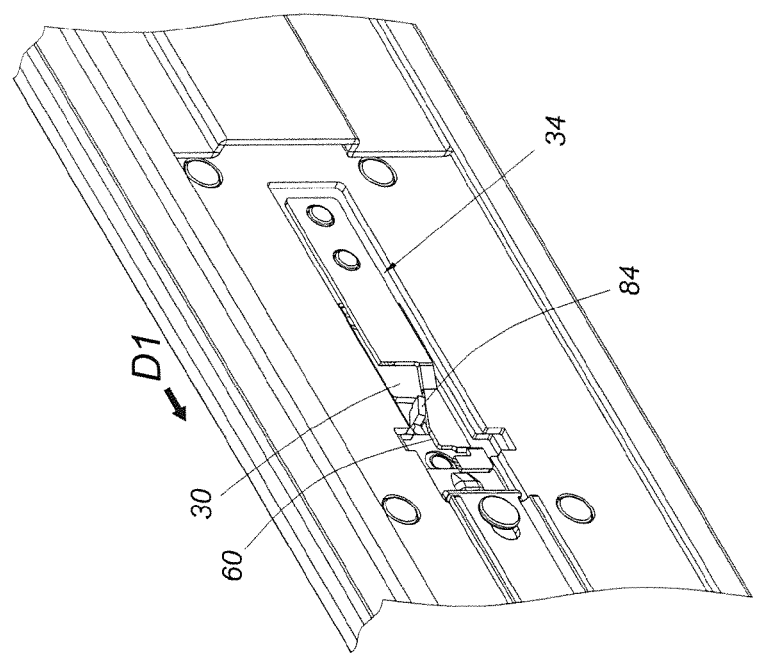
FIG. 8 is a perspective view in which the positioning member in FIG. 7 is displaced along with the second rail to a position adjacent to the blocking member such that a portion of the positioning member is guided by the guide section of the blocking member.

Referring to FIG. 7, FIG. 8, and FIG. 9, while the second rail 30 is being pulled out and displaced in a direction D1 toward an extended position relative to the first rail 28, the portion 84 of the positioning member 72 can be guided by the guide section 60 of the blocking member 34.

Figure 11:
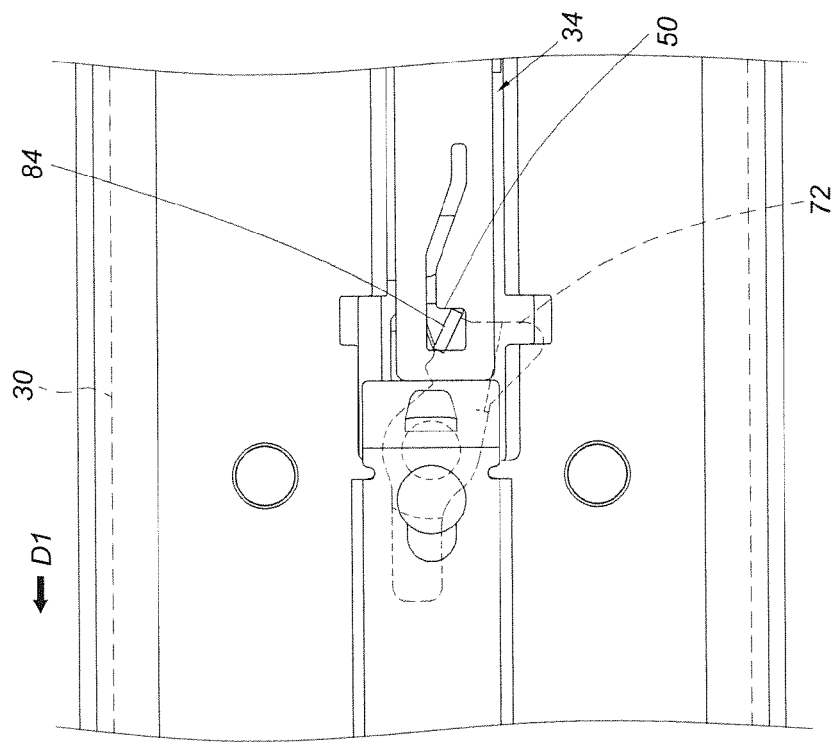
FIG. 11 is a drawing in which the positioning member in FIG. 10 is displaced to yet another position adjacent to the blocking member such that the aforesaid portion of the positioning member is blocked by a stop wall of the blocking member.
Figure 10:
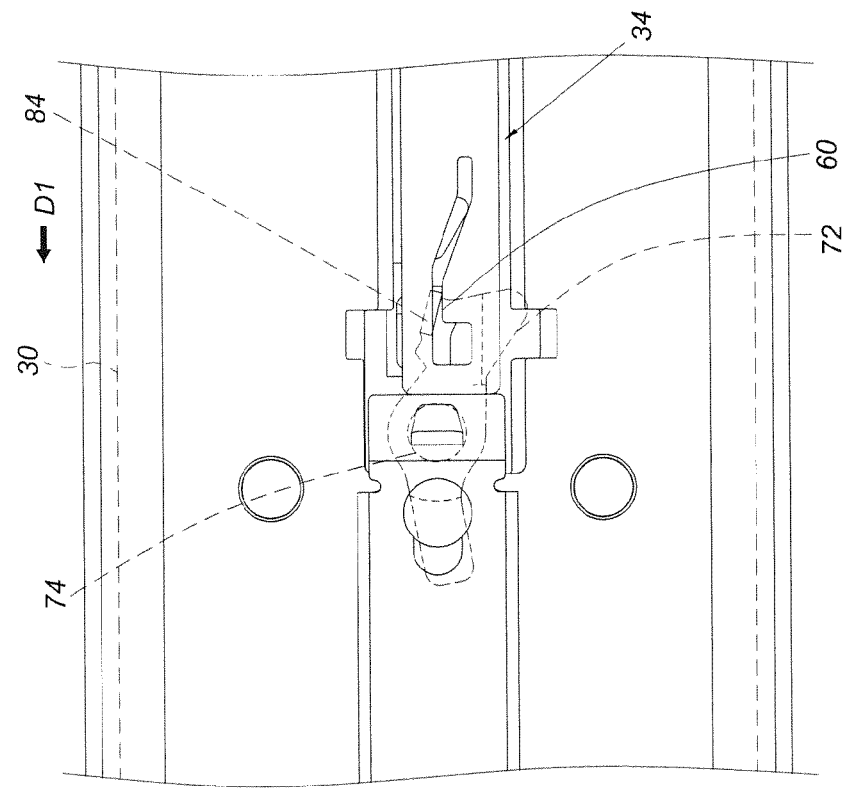
FIG. 10 is a drawing in which the positioning member in FIG. 8 is displaced to another position adjacent to the blocking member, and in which the aforesaid portion of the positioning member is further guided by the guide section of the blocking member, causing the positioning member to pivot about a connecting element.

As shown in FIG. 10 and FIG. 11, the portion 84 of the positioning member 72 can be guided by the guide section 60 of the blocking member 34 until blocked by the stop wall 50. In this embodiment, the guide section 60 includes a rising slope by way of example. While the second rail 30 is being displaced in the direction D1 toward the extended position, the portion 84 of the positioning member 72 is displaced according to the guide section 60, with the positioning member 72 rotated by an angle, and is consequently blocked by the stop wall 50. The second rail 30, when the portion 84 of the positioning member 72 is blocked by the stop wall 50, is positioned at the extended position P (see FIG. 5) relative to the first rail 28 and cannot be displaced relative to the first rail 28 in a retracting direction (which is the opposite direction of the direction DD.

Figure 13:
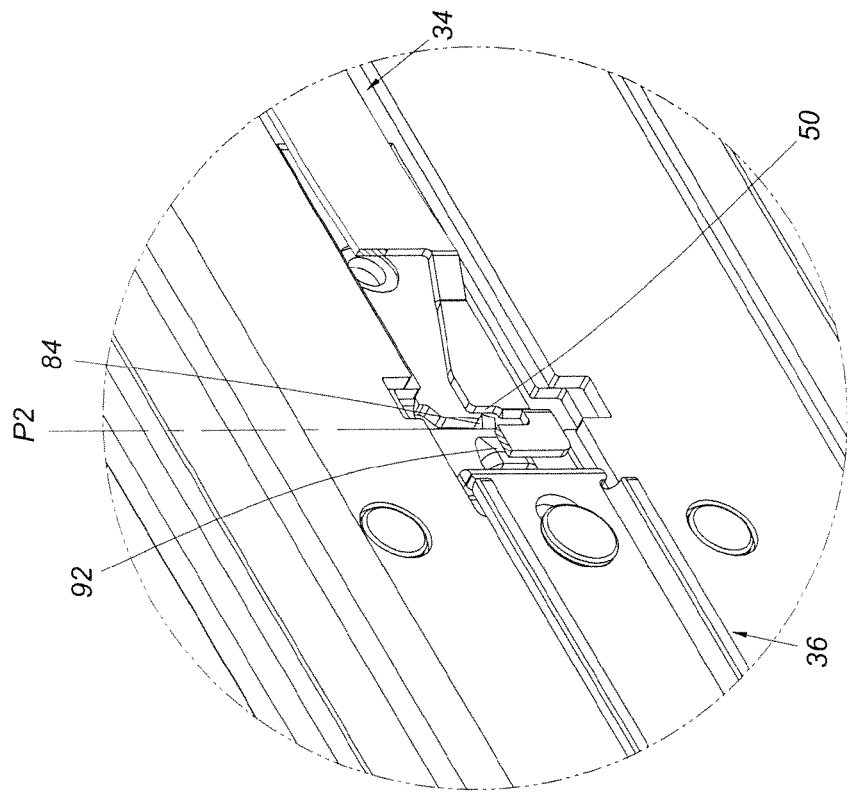
FIG. 13 is a perspective view showing how the aforesaid portion of the positioning member in FIG. 12 is released from the stop wall of the blocking member by operating the operating member.
Figure 12:
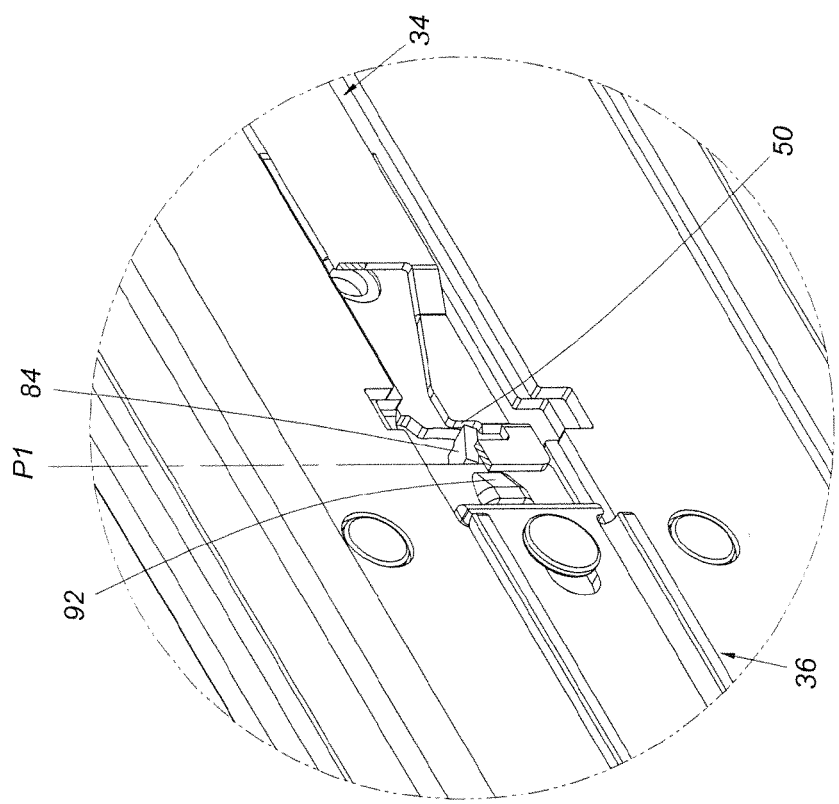
FIG. 12 is a partial enlarged view of the circled area 12 in FIG. 5, showing that the aforesaid portion of the positioning member is blocked by the stop wall of the blocking member.

Referring to FIG. 11, FIG. 12, and FIG. 13, when it is desired to release the portion 84 of the positioning member 72 from the stop wall 50 of the blocking member 34, the operating portion 90 of the operating member 36 (see FIG. 6) can be operated so that the operating member 36 is displaced from a first position P1 to a second position P2. As a result, the blocking member 34 is operated by the contact portion 92 of the operating member 36 and shifted in a certain direction (e.g., in a transverse direction as shown in FIG. 13, but not necessarily so) to release the portion 84 of the positioning member 72 from the stop wall 50 of the blocking member 34. In an embodiment which is not shown, the blocking member 34 also has a contact portion (e.g., a projection), by means of which the contact portion 92 of the operating member 36 can operate the blocking member 34, or more particularly can shift the blocking member 34 in the aforesaid direction. In practice, however, the shifting mechanism of the blocking member 34 is not limited to the foregoing.

Figure 15:
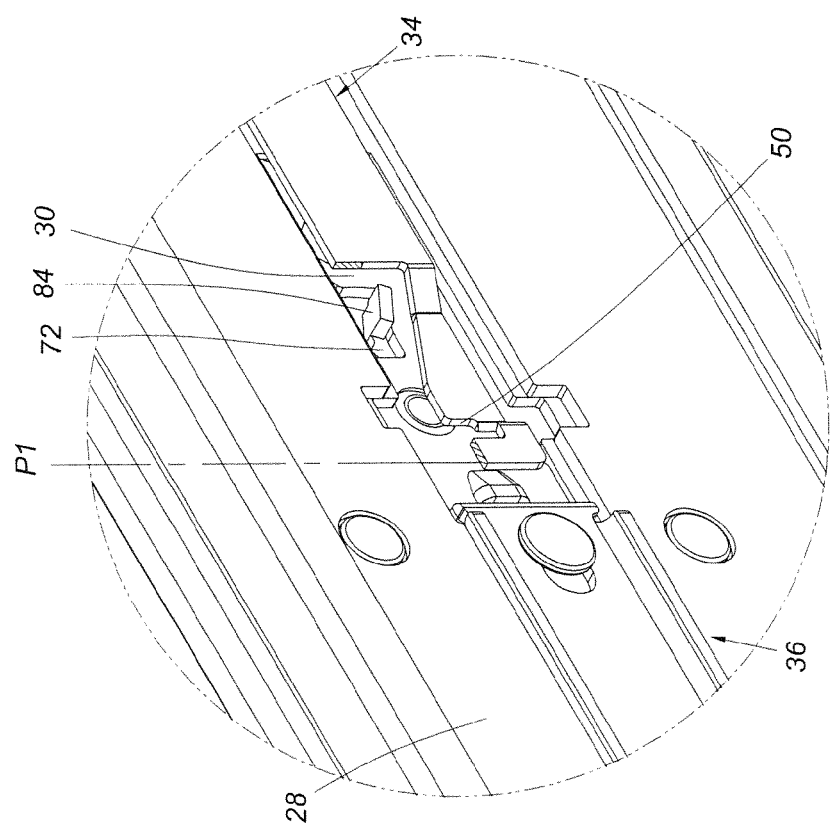
FIG. 15 is a perspective view in which the second rail in FIG. 14 is further retracted relative to the first rail, following the release of the aforesaid portion of the positioning member from the stop wall of the blocking member.
Figure 14:
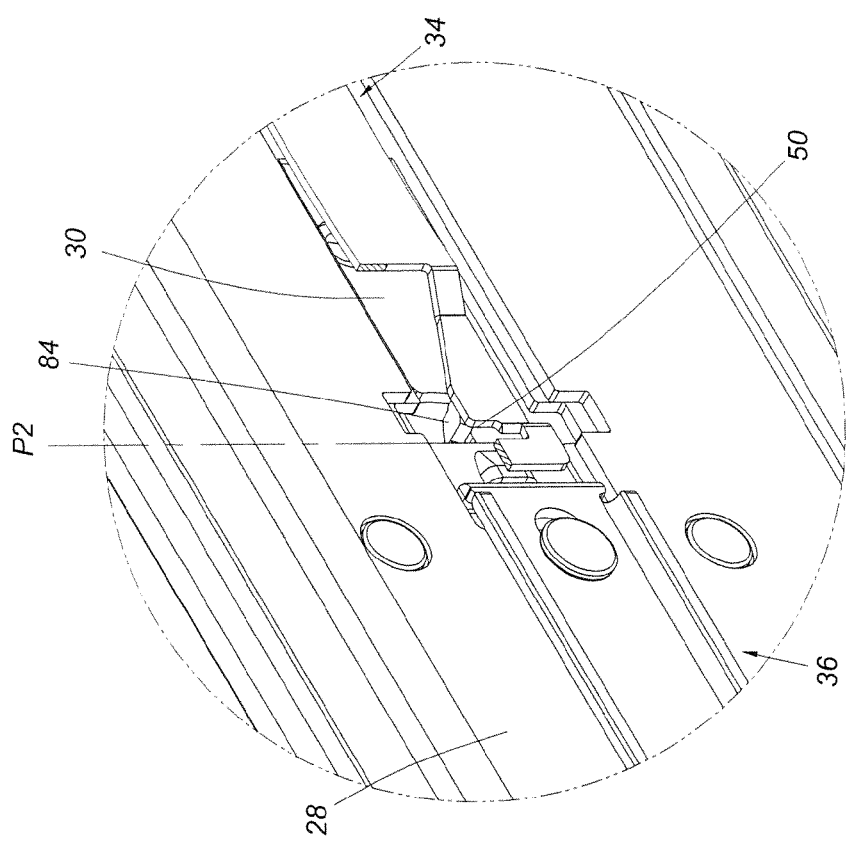
FIG. 14 is a perspective view in which the second rail is allowed to be retracted relative to the first rail now that the aforesaid portion of the positioning member in FIG. 13 is released from the stop wall of the blocking member.

Referring to FIG. 14, FIG. 15, and FIG. 16, once the portion 84 of the positioning member 72 is released from the stop wall 50 of the blocking member 34, the second rail 30 is allowed to be displaced from the extended position in the retracting direction relative to the first rail 28. In addition, thanks to the second elastic member 96, the operating member 36 is able to automatically return from the position as shown in FIG. 14 to its initial position as shown in FIG. 15; that is to say, the operating member 36 is able to automatically move from the second position P2 back to the first position P1.

Referring to FIG. 15, FIG. 16, and FIG. 16A, when the second rail 30 is further displaced in the retracting direction D2 relative to the first rail 28 following the release of the positioning member 72 from the blocking member 34, the reinforcement structure 70 of the second rail 30 passes the blocking member 34, presses against the blocking member 34 under the guidance of an inclined portion 58 of the blocking member 34, and thus shifts the blocking member 34 in a transverse direction, allowing the second rail 30 to be retracted relative to the first rail 28.

Referring to FIG. 17 and FIG. 17A, the second rail 30 is further displaced in the retracting direction D2, with the reinforcement structure 70 displaced along with the second rail 30 to a certain position relative to the blocking member 34. The second rail 30 can be displaced further in the retracting direction D2, as shown in FIG. 18, FIG. 18A, and FIG. 19A, until fully retracted, in which state the slide rail assembly 22 has a length L. In a nutshell, the overall extended length of the slide rail assembly 22 can be shortened by retracting the second rail 30, with a view to meeting the needs of a particular environment.

Referring to FIG. 19A and FIG. 19B, the slide rail assembly 22 is used in a certain environment to mount the object 20 to the rack 24. When the second rail 30 is at the extended position P relative to the first rail 28, and the third rail 32 mounted with the object 20 is pulled out relative to the second rail 30, a first space S1 exists between the third rail 32 (or the object 20) and an obstacle 106 (e.g., a wall, door, or other obstacle in the environment). If the first space S1 is too small, it will be impossible to perform maintenance work on the object 20 or the slide rail assembly 22. However, the operator can in that case release the portion 84 of the positioning member 72 from the stop wall 50 of the blocking member 34 by operating the operating member 36 (see description associated with FIG. 13) and then retract the second rail 30 from the extended position P relative to the first rail 28 to create a larger second space S2 between the third rail 32 (or the object 20) and the obstacle 106, thereby facilitating removal of the object 20 or maintenance of the slide rail assembly 22.

Figure 20B:
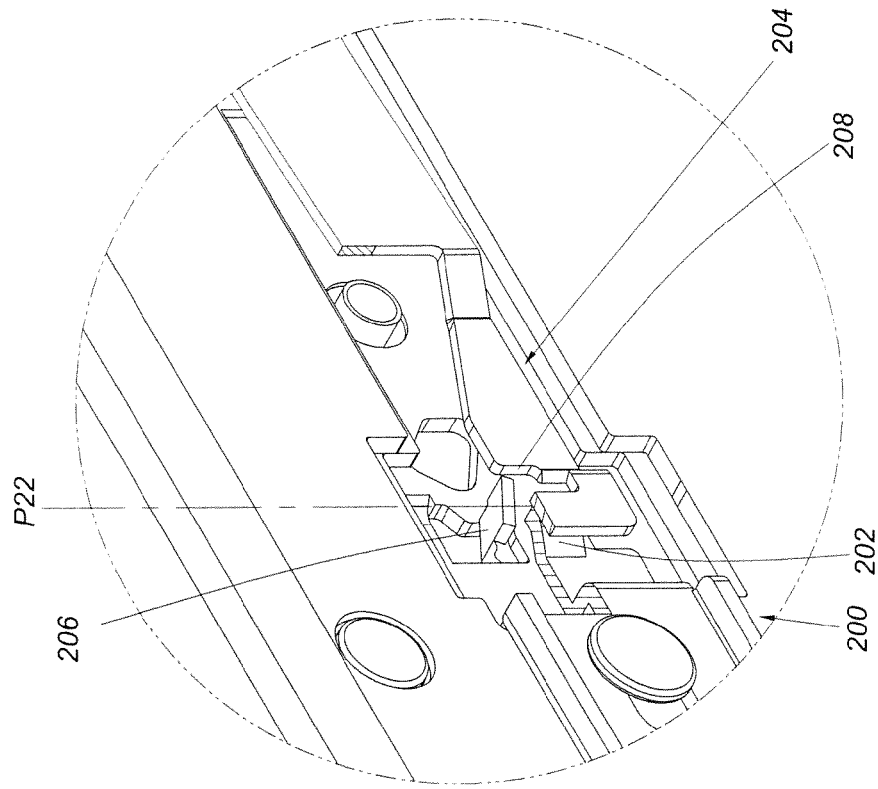
FIG. 20B shows how the blocking member in FIG. 20A is operated by the operating member to release the aforesaid portion of the positioning member from the stop wall of the blocking member.
Figure 20A:
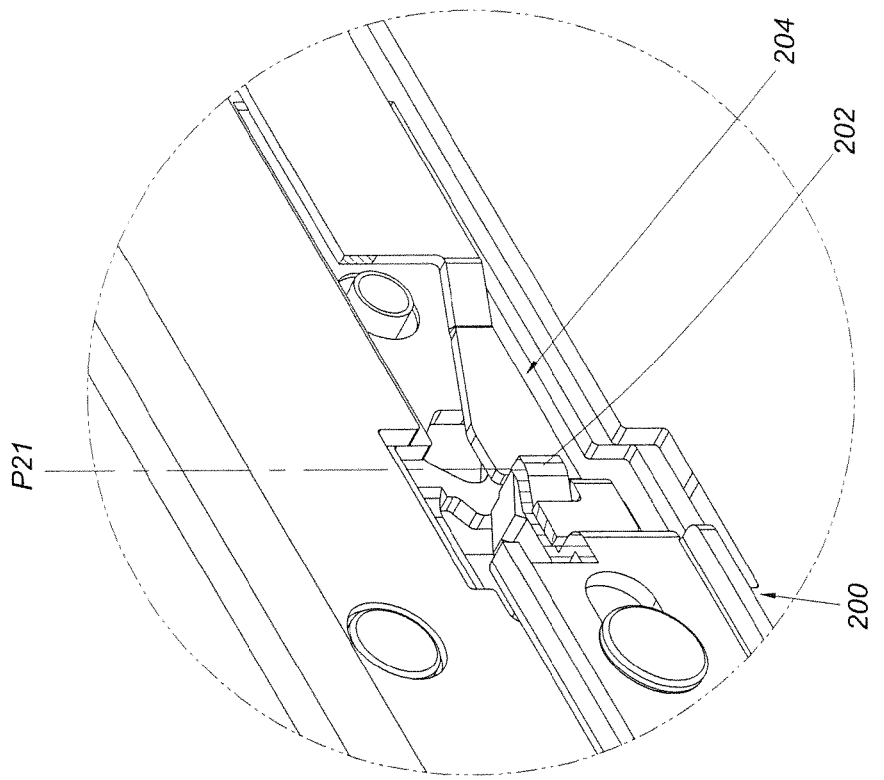
FIG. 20A is a perspective view showing how the operating member and the blocking member in another embodiment of the present invention are arranged.

FIG. 20A and FIG. 20B show another embodiment of the operating member. When the operating member 200 is at a first position P21, the contact portion 202 of the operating member 200 is adjacent to the blocking member 204. The operating member 200 can be operated and hence displaced from the first position P21 to a second position P22, in order for the contact portion 202 to operate the blocking member 204, or more particularly to shift the blocking member 204 in a certain direction, so that the portion 206 of the positioning member is released from the stop wall 208 of the blocking member 204.

While the present invention has been disclosed through the preferred embodiments described above, the embodiments are not intended to be restrictive of the invention. The scope of patent protection sought by the applicant is defined by the appended claims.

What is claimed is:
1. A slide rail assembly, comprising:
a first rail having an upper wall, a lower wall, and a sidewall extending between the upper wall and the lower wall, wherein the upper wall, the lower wall, and the sidewall jointly define a longitudinal channel, and the sidewall has an opening;
a second rail movably connected to the first rail and displaceable relative to the first rail in the longitudinal channel;
a blocking member attached to the first rail, the blocking member having a stop wall corresponding to the opening of the first rail;
a positioning member arranged at the second rail, the positioning member having a portion to be blocked by the stop wall of the blocking member when the second rail is displaced to an extended position relative to the first rail; and
an operating member movably connected to the first rail and configured to operate the blocking member and thereby release the portion of the positioning member from the stop wall of the blocking member;
wherein the second rail has an upper wall, a lower wall, and a sidewall extending between the upper wall and the lower wall, and the slide rail assembly further comprises a first connecting element pivotally connecting the positioning member to the sidewall of the second rail.

2. The slide rail assembly of claim 1, wherein the blocking member has a first portion connected to the sidewall of the first rail, a second portion distant from the first portion, and an auxiliary portion between the first portion and the second portion, the auxiliary portion comprising a guide section adjacent to the stop wall so that, while the second rail is being displaced toward the extended position, the portion of the positioning member is able to be guided by the guide section and blocked by the stop wall.

3. The slide rail assembly of claim 1, wherein the sidewall of the second rail has a mounting hole, and the portion of the positioning member extends through the mounting hole.

4. The slide rail assembly of claim 1, wherein the sidewall of the second rail has a mounting portion, and the slide rail assembly further comprises a first elastic member provided between the positioning member and the mounting portion.

5. The slide rail assembly of claim 1, wherein the operating member is longitudinally movably connected to the sidewall of the first rail so that, when operated, the operating member is displaced and shifts the blocking member in a direction, thereby releasing the portion of the positioning member from the stop wall of the blocking member.

6. The slide rail assembly of claim 4, further comprising a second elastic member arranged between the first rail and the operating member, and the second elastic member enables the operating member to automatically return from a position to an initial position.

7. The slide rail assembly of claim 6, wherein each of the first rail and the operating member has a connecting portion, and the second elastic member has two portions respectively connected to the connecting portion of the first rail and the connecting portion of the operating member.

8. The slide rail assembly of claim 1, wherein one of the first rail and the operating member has at least one slot, and a second connecting element extends through the at least one slot to connect the operating member to the first rail such that the operating member is displaceable relative to the first rail when operated.

9. The slide rail assembly of claim 1, wherein the second rail has a rear portion, the positioning member is connected to the second rail at a position adjacent to the rear portion, and the operating member has a longitudinal main body, an operating portion, and a contact portion, the operating portion and the contact portion being respectively connected to two corresponding ends of the longitudinal main body, the contact portion being adjacent to the opening of the sidewall of the first rail.

10. The slide rail assembly of claim 9, further comprising a bracket connected to the first rail, the bracket having at least one hole, the operating portion of the operating member extending through the at least one hole.

11. The slide rail assembly of claim 1, further comprising: a third rail and a reinforcement structure, wherein the third rail is longitudinally movably connected to the second rail, and the reinforcement structure is connected to at least one section of the second rail to increase structural strength of the at least one section of the second rail for supporting the third rail.

12. The slide rail assembly of claim 11, wherein the blocking member has an inclined portion so that, while the second rail is being displaced from the extended position in a retracting direction relative to the first rail, the reinforcement structure passes the blocking member and, under guidance of the inclined portion of the blocking member, presses against the blocking member to allow the second rail to be retracted relative to the first rail.

13. A slide rail assembly adapted to mount an object to a rack, the slide rail assembly comprising:
  a first rail connected to a first post and a second post of the rack via a first bracket and a second bracket respectively such that the first rail is between the first post and the second post, the first rail having an upper wall, a lower wall, and a sidewall extending between the upper wall and the lower wall, wherein the upper wall, the lower wall, and the sidewall jointly define a longitudinal channel, and the sidewall has an opening;
  a second rail movably connected to the first rail and displaceable to an extended position relative to the first rail in the longitudinal channel;
  a third rail longitudinally movably connected to the second rail and configured to be mounted with the object;
  a blocking member attached to the first rail, the blocking member having a stop wall corresponding to the opening of the first rail;
  a positioning member arranged at the second rail, the positioning member having a portion to be blocked by the stop wall of the blocking member when the second rail is displaced to the extended position; and
  an operating member movably connected to the first rail and configured to operate the blocking member and thereby release the portion of the positioning member from the stop wall of the blocking member so that the second rail is allowed to be retracted from the extended position relative to the first rail.

14. A slide rail assembly, comprising:
  a first rail having an upper wall, a lower wall, and a sidewall extending between the upper wall and the lower wall, wherein the upper wall, the lower wall, and the sidewall jointly define a longitudinal channel, and the sidewall has an opening;
  a second rail movably connected to the first rail and displaceable relative to the first rail in the longitudinal channel;
  a blocking member attached to the first rail, the blocking member having a stop wall corresponding to the opening of the first rail;
  a positioning member arranged at the second rail, the positioning member having a portion to be blocked by the stop wall of the blocking member when the second rail is displaced to an extended position relative to the first rail;
  an operating member movably connected to the first rail and configured to operate the blocking member and thereby release the portion of the positioning member from the stop wall of the blocking member; and
  a bracket connected to the first rail, the bracket having at least one hole;
  wherein the second rail has a rear portion, the positioning member is connected to the second rail at a position adjacent to the rear portion, and the operating member has a longitudinal main body, an operating portion, and a contact portion, the operating portion and the contact portion being respectively connected to two corresponding ends of the longitudinal main body, the contact portion being adjacent to the opening of the sidewall of the first rail, and the operating portion of the operating member extending through the at least one hole.

15. A slide rail assembly, comprising:
- a first rail having an upper wall, a lower wall, and a sidewall extending between the upper wall and the lower wall, wherein the upper wall, the lower wall, and the sidewall jointly define a longitudinal channel, and the sidewall has an opening;
- a second rail movably connected to the first rail and displaceable relative to the first rail in the longitudinal channel;
- a blocking member attached to the first rail, the blocking member having a stop wall corresponding to the opening of the first rail;
- a positioning member arranged at the second rail, the positioning member having a portion to be blocked by the stop wall of the blocking member when the second rail is displaced to an extended position relative to the first rail;
- an operating member movably connected to the first rail and configured to operate the blocking member and thereby release the portion of the positioning member from the stop wall of the blocking member;
- a third rail longitudinally movably connected to the second rail; and
- a reinforcement structure connected to at least one section of the second rail to increase structural strength of the at least one section of the second rail for supporting the third rail.

16. The slide rail assembly of claim 15, wherein the blocking member has an inclined portion so that, while the second rail is being displaced from the extended position in a retracting direction relative to the first rail, the reinforcement structure passes the blocking member and, under guidance of the inclined portion of the blocking member, presses against the blocking member to allow the second rail to be retracted relative to the first rail.

* * * * *